United States Patent
Lee et al.

(10) Patent No.: US 11,515,231 B2
(45) Date of Patent: Nov. 29, 2022

(54) COATING METHOD FOR LIQUID METAL THERMAL GREASE AND HEAT DISSIPATION MODULE

(71) Applicant: ASUSTeK COMPUTER INC., Taipei (TW)

(72) Inventors: Chia-Chang Lee, Taipei (TW); Chun-Chieh Wong, Taipei (TW); Cheng-Yu Wang, Taipei (TW); Tai-Min Hsu, Taipei (TW); Yao-Jen Chang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/931,560

(22) Filed: Jul. 17, 2020

(65) Prior Publication Data
US 2021/0066160 A1    Mar. 4, 2021

(30) Foreign Application Priority Data
Aug. 27, 2019  (TW) .................. 108130684

(51) Int. Cl.
*H01L 23/373* (2006.01)
*B05C 9/12* (2006.01)
*B05D 5/12* (2006.01)

(52) U.S. Cl.
CPC ............ *H01L 23/3736* (2013.01); *B05C 9/12* (2013.01); *B05D 5/12* (2013.01)

(58) Field of Classification Search
CPC ........................................ B05D 5/12
See application file for complete search history.

(56) References Cited

U.S. PATENT DOCUMENTS

| | | | |
|---|---|---|---|
| 4,955,298 A * | 9/1990 | Zimmer | B05C 11/025 118/213 |
| 5,056,706 A | 10/1991 | Dolbear et al. | |
| 5,459,352 A | 10/1995 | Layton et al. | |
| 6,570,099 B1 * | 5/2003 | Hirano | H01L 23/49861 257/E23.101 |
| 7,219,713 B2 | 5/2007 | Gelorme et al. | |
| 2005/0228097 A1 * | 10/2005 | Zhong | B82Y 30/00 524/439 |
| 2006/0131738 A1 | 6/2006 | Furman et al. | |

(Continued)

FOREIGN PATENT DOCUMENTS

| | | |
|---|---|---|
| CN | 100452371 C | 1/2009 |
| CN | 107527675 A | 12/2017 |
| CN | 207086240 U | 3/2018 |

(Continued)

*Primary Examiner* — Dah-Wei D. Yuan
*Assistant Examiner* — Kristen A Dagenais-Englehart
(74) *Attorney, Agent, or Firm* — McClure, Qualey & Rodack, LLP

(57) ABSTRACT

A coating method applied to perform coating with liquid metal thermal grease and a heat dissipation module are provided. The coating method includes: providing liquid metal thermal grease on a surface of an electronic element, and scraping the liquid metal thermal grease by a scraper, to coat the surface of the electronic element with the liquid metal thermal grease. A surface of the scraper is roughened. According to the coating method, the surface of the electronic element is evenly coated with the liquid metal thermal grease effectively.

8 Claims, 5 Drawing Sheets

(56) References Cited

U.S. PATENT DOCUMENTS

2010/0246133 A1    9/2010  Schmidt et al.
2014/0240928 A1*   8/2014  Tien .................... C10M 169/04
                                                           508/172

FOREIGN PATENT DOCUMENTS

| CN | 106929733 | B  | 6/2018  |
| CN | 208810466 | U  | 5/2019  |
| EP | 1143512   | A2 | 10/2001 |
| TW | 200636956 | A  | 10/2006 |
| WO | 2006078334 | A1 | 7/2006 |
| WO | 2019019084 | A1 | 1/2019 |

* cited by examiner

COATING METHOD FOR LIQUID METAL THERMAL GREASE AND HEAT DISSIPATION MODULE

CROSS-REFERENCE TO RELATED APPLICATION

This application claims the priority benefit of Taiwan application serial No. 108130684, filed on Aug. 27, 2019. The entirety of the above-mentioned patent application is hereby incorporated by reference herein and made a part of the specification.

BACKGROUND OF THE INVENTION

Field of the Invention

The disclosure relates to a coating method for liquid metal thermal grease and a heat dissipation module provided with liquid metal thermal grease.

Description of the Related Art

A large amount of heat is usually generated when a processor or electronic elements of an electronic device operates at a high speed, resulting in increasing a temperature of the processor or the electronic elements. However, the excessively high temperature increases efficiency loss of the processor or the electronic elements, and even shortens a service life of the processor or the electronic elements. Therefore, heat dissipation is vitally important for the processor or the electronic elements for the electronic device.

In conventional heat dissipation manners, thermal grease and a heat dissipation element are usually used, so that heat from a processor or electronic elements is conducted to the heat dissipation element. The heat conduction and dissipation are improved by using a metal heat dissipation element which is easy to perform heat dissipation. However, conventional thick thermal grease has a low heat conductivity coefficient and cannot effectively conduct heat from the processor or the electronic elements to the heat dissipation element. Therefore, liquid metal thermal grease having a high heat conductivity coefficient gradually replaces the conventional thick thermal grease and is applied to a heat dissipation module of an electronic device.

Although the liquid metal thermal grease has a high heat conductivity coefficient, cohesion of the liquid metal thermal grease is greater than adhesion of the liquid metal thermal grease to a surface of the processor or the electronic elements. As a result, it is difficult to evenly coat the liquid metal thermal grease on the surface of the processor or the electronic elements. In addition, it is difficult to control the usage amount of the liquid metal thermal grease, and when the liquid metal thermal grease applies too much, the liquid metal thermal grease is likely to overflow from the surface of the processor or the electronic elements, resulting in short circuit of a surrounding circuit.

BRIEF SUMMARY OF THE INVENTION

The disclosure provides a coating method, applied to coat an electronic element with liquid metal thermal grease.

The disclosure also provides a heat dissipation module, configured to dissipate heat.

The coating method disclosed herein includes steps of: providing the liquid metal thermal grease on a surface of an electronic element, and scraping the liquid metal thermal grease by a scraper to coat the surface of the electronic element with the liquid metal thermal grease. A surface of the scraper is roughened.

The disclosure further provides a coating method applied to perform coating with liquid metal thermal grease includes steps of: providing the liquid metal thermal grease on a surface of a scraper, and smearing a surface of an electronic element by using the surface of the scraper. The surface of the scraper is roughened.

The disclosure further provides a heat dissipation module configured to dissipate heat. The heat dissipation module is configured to connect to an electronic element, the module includes a heat dissipation element and liquid metal thermal grease. The liquid metal thermal grease is located between a surface of the electronic element and a surface of the heat dissipation element, and the liquid metal thermal grease is in contact with the surface of the electronic element and the surface of the heat dissipation element.

According to the coating method provided in the disclosure, a scraper of which a surface is roughened scrapes liquid metal thermal grease provided on a surface of an electronic element, to coat the surface of the electronic element with the liquid metal thermal grease.

The heat dissipation module provided in the disclosure is configured to connect to an electronic element and is capable of performing heat dissipation.

BRIEF DESCRIPTION OF THE DRAWINGS

Specific embodiments of the disclosure are further described with reference to the following embodiments and accompanying drawings.

FIG. 2 to FIG. 4A and FIG. 5 to FIG. 6 are three-dimensional schematic diagrams during an actual operation according to the coating method shown in FIG. 1;

DETAILED DESCRIPTION OF THE EMBODIMENTS

Figure 1:
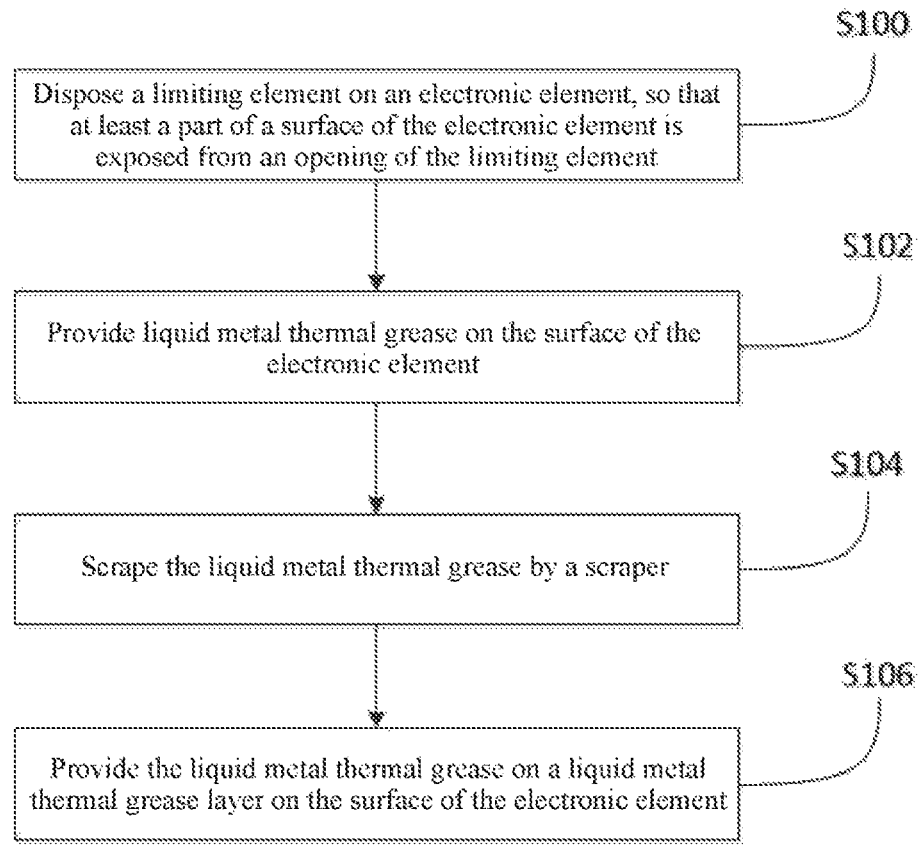
FIG. 1 is a flowchart of a coating method applied to perform coating with liquid metal thermal grease according to an embodiment of the disclosure.

Various embodiments of the disclosure will be disclosed below in the accompanying drawings, and for purposes of clarity of illustration, numerous practical details will be set forth in the following description. It should be understood, however, that these practical details are not intended to limit the disclosure. That is, in some embodiments of the disclosure, such practical details are unnecessary. In addition, some well-known and customary structures and elements will be shown in the drawings in a simple schematic manner for the sake of simplifying the drawings.

FIG. 1 is a flowchart of a coating method applied to perform coating with liquid metal thermal grease according to an embodiment of the disclosure. A concept of a coating method for liquid metal thermal grease in this embodiment may be applied to any electronic device in which liquid metal thermal grease is used as a heat conduction medium between an electronic element and a heat dissipation element. As shown in FIG. 1, in this embodiment, the coating method includes steps S100 to S106. The following describes the coating method in this embodiment by using a three-dimensional schematic diagram of the coating method during an actual operation shown in FIG. 2 to FIG. 6 as an example. Some steps are selectively designed, and details are described later.

Figure 2:
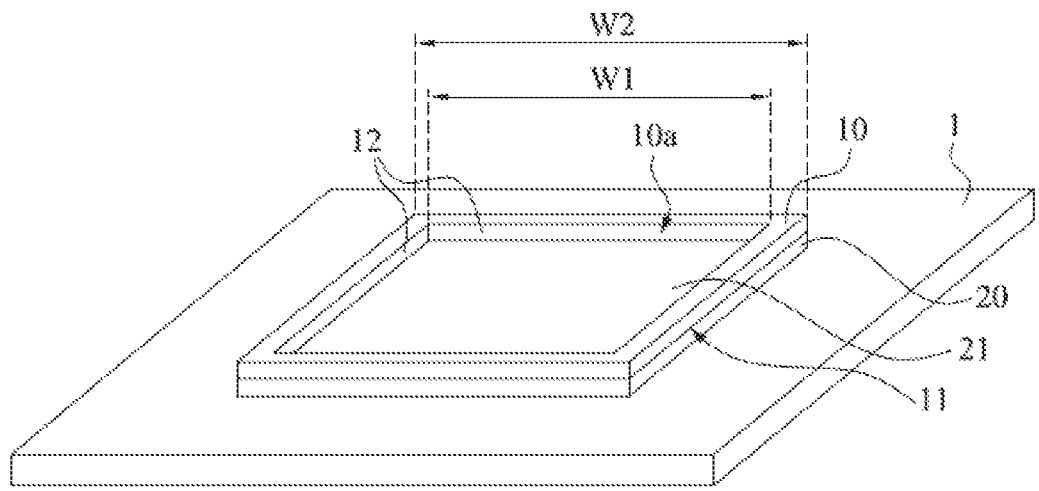

In step S100, a limiting element 10 is disposed on an electronic element 20, so that at least a part of a surface 21 of the electronic element 20 is exposed from an opening 10a of the limiting element 10. As shown in FIG. 2, a circuit board 1 includes the electronic element 20 with the surface 21. The limiting element 10 includes the opening 10a and a lower surface 11. The limiting element 10 is disposed on the electronic element 20, so that the lower surface 11 of the limiting element 10 is against the surface 21 of the electronic element 20. In this way, at least a part of the surface 21 of the electronic element 20 and an inner side wall 12 which is of the limiting element 10 and that is adjacent to the opening 10a is exposed from the opening 10a of the limiting element 10.

Further, a width W1 of the opening 10a is less than a width W2 of the surface 21 of the electronic element 20. Therefore, a part of the surface 21 of the electronic element 20 is exposed from the opening 10a. However, the disclosure is not limited thereto. In an embodiment, the limiting element 10 further surrounds a side edge of the electronic element 20 and is against the circuit board 1. In this way, disposing the limiting element 10 on the electronic element 20 is convenient for a user.

In some embodiments, when the electronic element 20 is a central processing unit (CPU) chip set, or a graphic processing unit (GPU) chip set, or an electronic element 20 which generates a large quantity of heat when operating at a high speed. The disclosure is not limited thereto.

Figure 3:
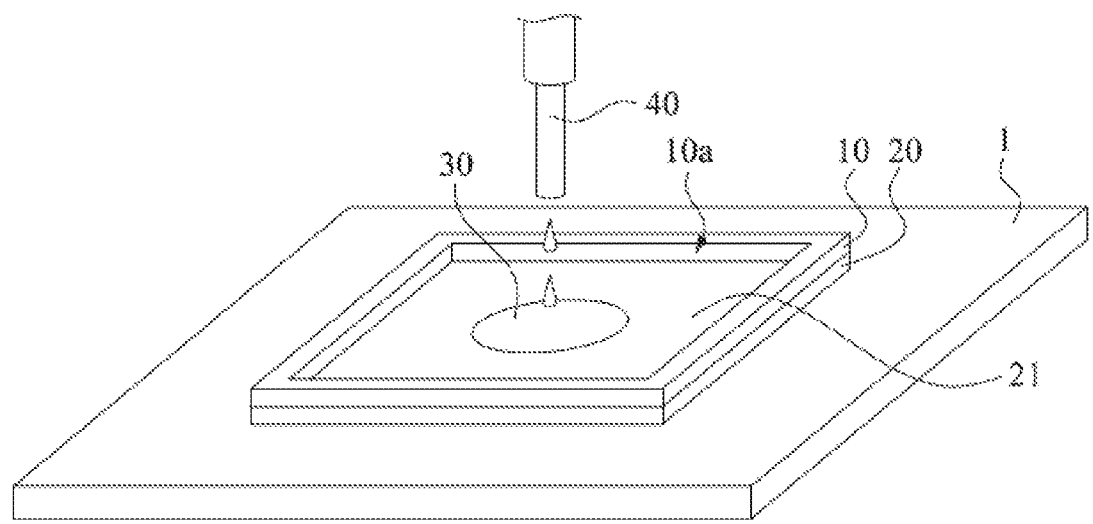

Subsequently in step S102, liquid metal thermal grease 30 is provided on the surface 21 of the electronic element 20. In an embodiment, as shown in FIG. 3, an amount of the liquid metal thermal grease 30 is provided on the surface 21 exposed from the opening 10a by using a glue dispenser 40. Because cohesion of the liquid metal thermal grease 30 is greater than adhesion of the liquid metal thermal grease 30 to the surface 21 of the electronic element 20, the liquid metal thermal grease 30 centrally forms one or more spheres or spheroids on the surface 21 of the electronic element 20, and are hard evenly distributed on the surface 21 of the electronic element 20. When an external force is applied to the spheres formed by the liquid metal thermal grease 30, due to the cohesion, the spheres tend to move or roll in a complete form, instead of changing a shape due to the external force.

In some embodiments, the liquid metal thermal grease 30 includes at least one of gallium, indium, stannum, zinc, plumbum, bismuth, platinum, palladium, manganese, magnesium, cuprum, argentum, and gold. However, the disclosure is not limited thereto.

In some embodiments, the liquid metal thermal grease 30 comprises at least gallium or a gallium compound, and content of the gallium or the gallium compound is at least more than 85%.

In some embodiments, a heat conductivity of the liquid metal thermal grease 30 is approximately 70 to 75 W/mK. W is watt, m is meter, and K is kelvin or referred to as a kelvin temperature.

In some embodiments, a melting point of the liquid metal thermal grease 30 is approximately 20° C. to 50° C.

In some embodiments, a viscosity of the liquid metal thermal grease 30 is approximately 0.0019 to 0.0022 poise (P).

Figure 4A:
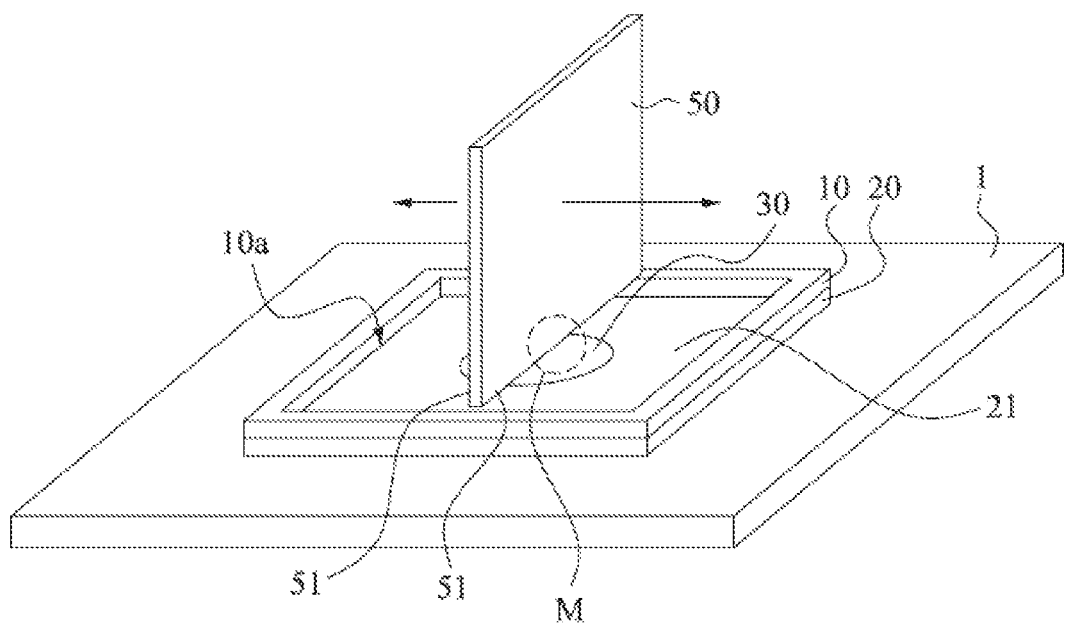
Figure 4B:
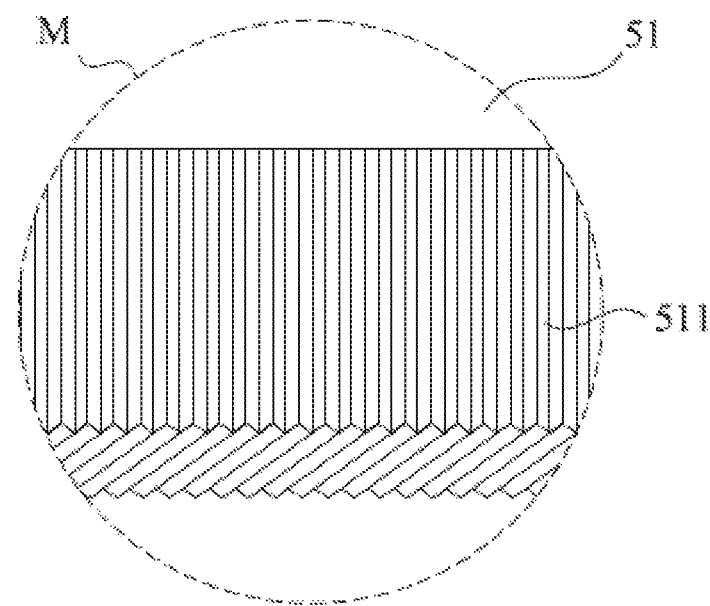
FIG. 4B is an enlarged view of a part in a circle in FIG. 4A.

In step S104, the liquid metal thermal grease 30 is scraped by a scraper 50 with a roughened surface. As shown in FIG. 4A and FIG. 4B, the liquid metal thermal grease 30 on the surface 21 of the electronic element 20 is scraped by the scraper 50, so that the liquid metal thermal grease 30 is evenly distributed on the surface 21 of the electronic element 20. In addition, before the liquid metal thermal grease 30 is scraped by the scraper 50, the surface 51 is pre-roughened, so that the surface 51 includes uneven-shaped roughened structure 511. In an embodiment, as shown in FIG. 4B, FIG. 4B is an enlarged view of a part in a circle in FIG. 4A. The roughened structure 511 is in a zigzag shape. In another embodiment, the roughened structure 511 is in an irregular undulation shape. However, the disclosure is not limited thereto. In an embodiment, when an average particle diameter (micrometer) is taken as a standard, a roughness value of the roughened structure 511 is less than 58.5.

In some embodiments, one surface 51 of the scraper 50 is of the roughened structure 511. In this embodiment, the user uses the surface 51 with the roughened structure 511 of the scraper 50 to contact the surface 21 of the electronic element 20, to push the liquid metal thermal grease 30 by using the roughened structure 511 of the surface 51. In some other embodiments, both front and back surfaces 51 of the scraper 50 are of the roughened structure 511. In this way, the user alternately uses the front and back surfaces 51 of the scraper 50 to contact the surface 21 of the electronic element 20, to push the liquid metal thermal grease 30 back and forth by using the roughened structures 511 of the front and back surfaces 51 of the scraper 50.

In some embodiments, the surface 51 near a blade of the scraper 50 is roughened. The surface 51 away from the blade, such as a grip of the scraper 50, may not be roughened, so that the grip of the scraper 50 is still provided with a smooth surface. However, the disclosure is not limited thereto. An area of the roughened surface 51 of the scraper 50 is not limited herein.

When scraping the liquid metal thermal grease 30 on the surface 21 of the electronic element 20 by the scraper 50, the user or a machine provides a downward component force, so that the roughened structure 511 of the surface 51 of the scraper 50 is immersed in the liquid metal thermal grease 30. In this way, a part of the liquid metal thermal grease 30 falls into a groove of the roughened structure 511, and a shape of the liquid metal thermal grease 30 is changed. In this case, when the scraper 50 moves, the shape of the liquid metal thermal grease 30 is driven to be changed, instead of merely pushing the liquid metal thermal grease 30. In this way, the surface 21 of the electronic element 20 is coated with the liquid metal thermal grease 30 as the scraper 50 moves.

Figure 5:
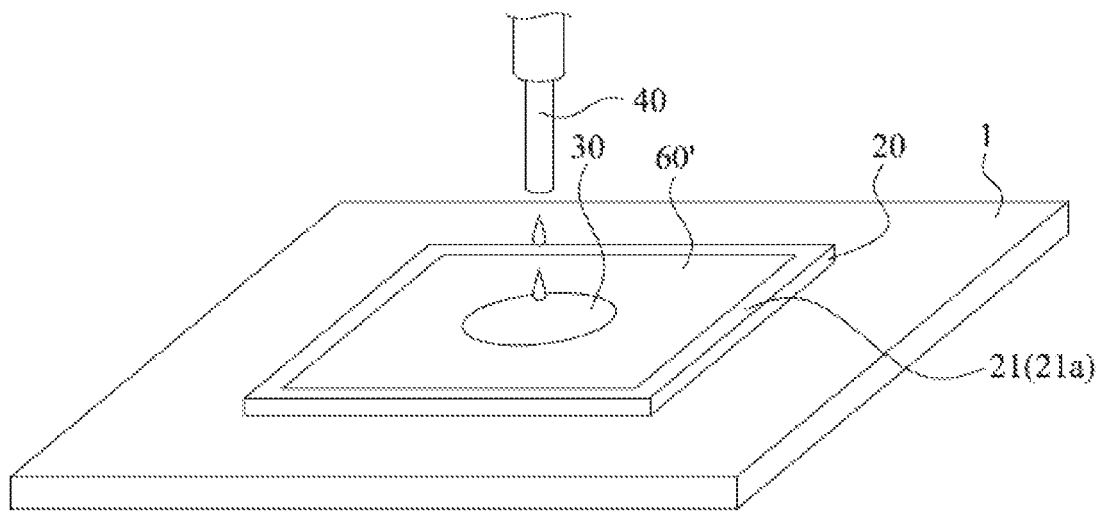
Figure 6:
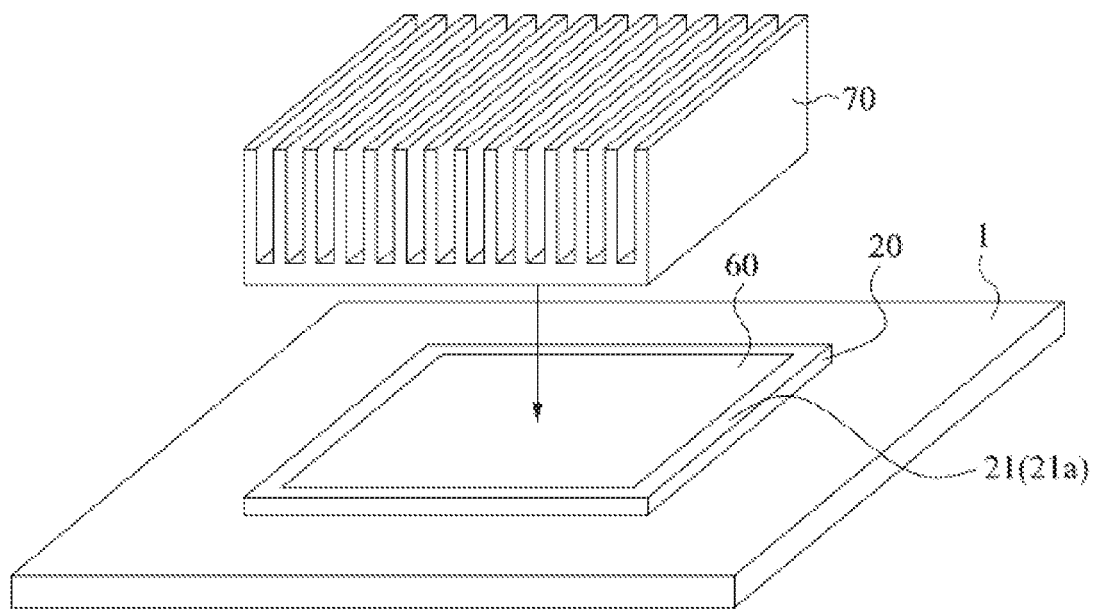

Further, a moving area of the scraper 50 is limited to a part surrounded by an outer edge of the opening 10a of the limiting element 10, so that only the part of the surface 21 exposed from the opening 10a of the limiting element 10 is coated with the liquid metal thermal grease 30. In this way, a part of the surface 21 covered by the limiting element 10 is used as a buffer area 21a (as shown in FIG. 5 and FIG. 6), to avoid a case in which excessive liquid metal thermal grease 30 overflows from the surface 21 of the electronic element 20 to cause short circuit of a circuit disposed around the electronic element 20.

In some embodiments, the scraper 50 is made of a silicone or rubber material. In this way, the surface 21 of the electronic element 20 is prevented from being scratched when the scraper 50 scrapes the liquid metal thermal grease 30. However, the disclosure is not limited thereto. Any material that is not easy to absorb the liquid metal thermal grease 30 and does not cause damage to the surface 21 of the electronic element 20 after the material is roughened is applicable to the scraper 50 in the coating method in the disclosure.

In some embodiments, the surface 51 of the scraper 50 is roughened through polishing, sand blasting, or chemical etching. However, the disclosure is not limited thereto.

In step S106, the liquid metal thermal grease 30 is provided on the surface 21 of the electronic element 20 again. As shown in FIG. 5, after the surface 21 of the electronic element 20 is coated with the liquid metal thermal grease 30 by the scraper 50, a liquid metal thermal grease layer 60' is formed on the surface 21 of the electronic element 20. A contour of an outer edge of the liquid metal thermal grease layer 60' is the same as a contour of an inner edge of the opening 10a.

After the limiting element 10 is removed, a predetermined amount of the liquid metal thermal grease 30 is provided on the liquid metal thermal grease layer 60' on the surface 21 by using the glue dispenser 40 again. The surface 21 of the electronic element 20 is coated with the liquid metal thermal grease layer 60'. Therefore, when the liquid metal thermal grease 30 is provided on the surface 21 of the electronic element 20 again, due to a strong affinity between homogeneous molecules, the liquid metal thermal grease 30 provided again is naturally dispersed on the liquid metal thermal grease layer 60', and evenly distributed on the liquid metal thermal grease layer 60'.

In some embodiments, the predetermined amount of the liquid metal thermal grease 30 provided for the second time is greater than the predetermined amount of the liquid metal thermal grease 30 provided for the first time. In an embodiment, the predetermined amount of the liquid metal thermal grease 30 provided for the second time is approximately 12 to 14 times the predetermined amount of the liquid metal thermal grease 30 provided for the first time. However, the disclosure is not limited thereto.

In some embodiments, step S106 may be repeated for one or more times. The disclosure is not limited thereto.

In some embodiments, after step S106, a heat dissipation element is subsequently disposed on the liquid metal thermal grease 30 and the electronic element 20. As shown in FIG. 6, a final liquid metal thermal grease layer 60 is obtained after the liquid metal thermal grease 30 is provided on the liquid metal thermal grease layer 60' on the surface 21 of the electronic element 20 for one or more times. Then, the heat dissipation element 70 is disposed on the liquid metal thermal grease layer 60 and the electronic element 20, so that the liquid metal thermal grease layer 60 is located between the heat dissipation element 70 and the electronic element 20.

Further, the liquid metal thermal grease 30 that is in the liquid metal thermal grease layer 60 and is pressed by the heat dissipation element 70 partially flows into the buffer area 21a, so as to avoid a case in which the liquid metal thermal grease 30 overflows from the surface 21 of the electronic element 20 to cause short circuit of an electronic component around the electronic element 20. A form of the heat dissipation element 70 is not limited herein.

Figure 7:
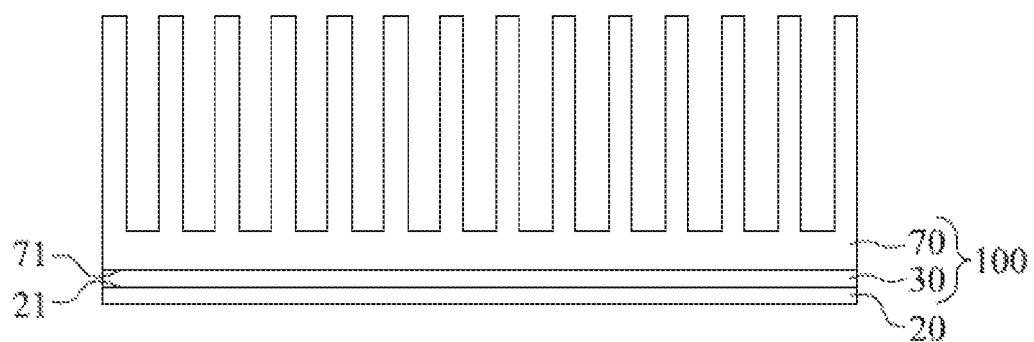
FIG. 7 is a side view of a heat dissipation module according to an embodiment of the disclosure.

As shown in FIG. 7, FIG. 7 is a side view of a heat dissipation module 100 according to an embodiment of the disclosure. The heat dissipation module 100 includes a heat dissipation element 70 and liquid metal thermal grease 30. The surface 21 of the electronic element 20 is coated with the liquid metal thermal grease 30 through the coating method shown in FIG. 1 to FIG. 6. The liquid metal thermal grease 30 is located between the electronic element 20 and the heat dissipation element 70, and is in direct contact with the surface 21 of the electronic element 20 and a surface 71 of the heat dissipation element 70.

Actually, a gap between the heat dissipation element 70 and the electronic element 20 is very small, so that the liquid metal thermal grease 30 is adsorbed between the surface 71 of the heat dissipation element 70 and the surface 21 of the electronic element 20 through capillarity. Adsorption performed through capillarity contributes to avoiding a case in which the liquid metal thermal grease 30 flows out of an outer edge of the surface 21 of the electronic element 20 to cause an electrical fault of an electronic component around the electronic element 20. In addition, the liquid metal thermal grease 30 with a high heat conductivity coefficient can quickly conduct heat of the electronic element 20 to the heat dissipation element 70 for heat dissipation. In this way, a temperature of the electronic element 20 is effectively decreased, so that the electronic device operates more smoothly.

In some embodiments, the liquid metal thermal grease 30 is provided on a predetermined location on the surface 21, as shown in FIG. 3 and FIG. 5. However, the disclosure is not limited thereto.

Figure 8:
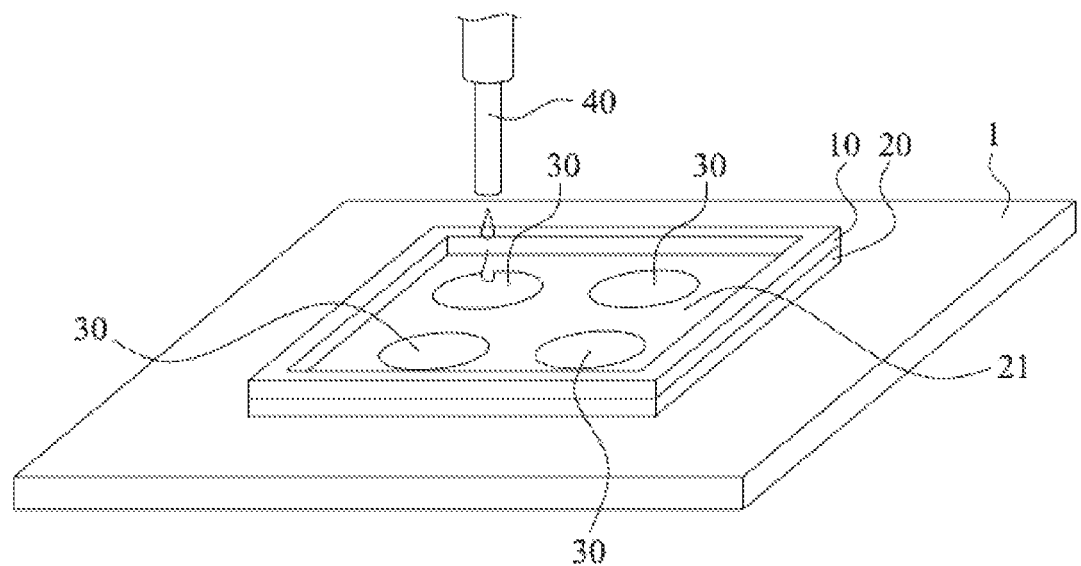
FIG. 8 is a three-dimensional schematic diagram during an actual operation according to another embodiment of step S102 of the disclosure.

In some other embodiments, in step S102, the liquid metal thermal grease 30 is provided on a plurality of predetermined locations on the surface 21 of the electronic element 20. As shown in FIG. 8, the liquid metal thermal grease 30 is provided on four predetermined locations on the surface 21 of the electronic element 20, to initially disperse the liquid metal thermal grease 30 on the surface 21 and improve efficiency of the overall method. However, the disclosure is not limited thereto.

Figure 9:
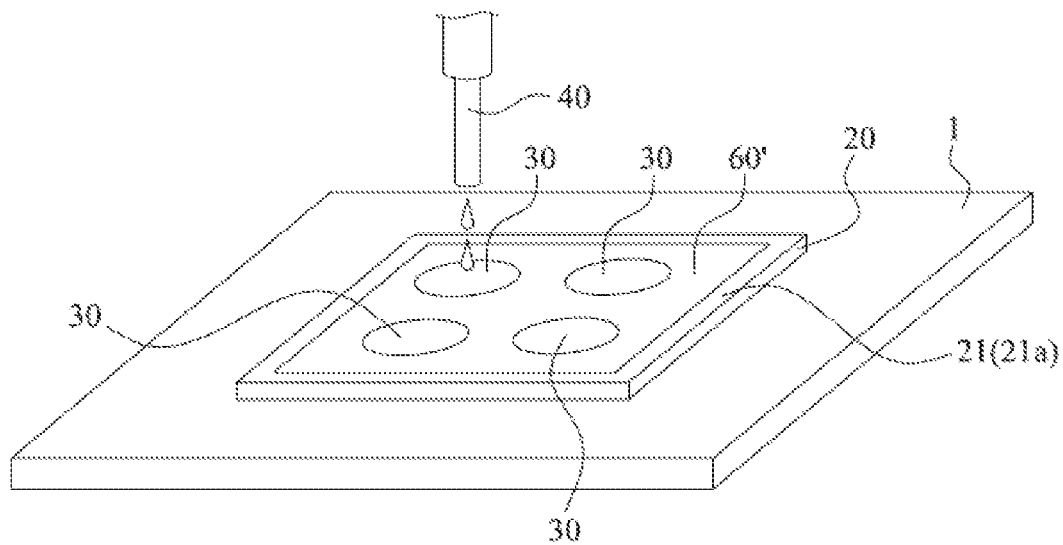
FIG. 9 is a three-dimensional schematic diagram during an actual operation according to another embodiment of step S106 of the disclosure.

In some embodiments, in step S106, the liquid metal thermal grease 30 is provided on a plurality of predetermined locations on the surface 21. In an embodiment, as shown in FIG. 9, there are four predetermined locations. However, the disclosure is not limited thereto. That is, the liquid metal thermal grease 30 is provided on the liquid metal thermal grease layer 60' at the plurality of predetermined locations to form the liquid metal thermal grease layer 60. In other words, a quantity of the predetermined locations is flexibly adjusted according to an actual operation status. The disclosure is not limited thereto.

In an embodiment, the plurality of predetermined locations is predetermined locations obtained by taking, after taking equal diversion points on edges of the surface 21, an intersection point of connecting lines of opposite equal diversion points.

In some embodiments, step S106 is selectively omitted. In the embodiments, the amount of the liquid metal thermal grease 30 in step S102 is a total amount of the liquid metal thermal grease 30 in step S102 and step S106.

In some embodiments, the liquid metal thermal grease 30 in step S102 is provided on the surface 21 of the electronic element 20 in another proper manner. In an embodiment, the liquid metal thermal grease 30 is first provided on the surface 51 that is of the scraper 50 and is of the roughened structure 511, and then contacts the surface 21 of the electronic element 20 by using the surface 51 of the scraper 50, so that the liquid metal thermal grease 30 is provided on the surface 21 of the electronic element 20. Subsequently, the surface 21 of the electronic element 20 is further smeared by the scraper 50, so that the surface 21 of the electronic element 20 is coated with the liquid metal thermal grease 30. However, the disclosure is not limited thereto.

According to the foregoing detailed descriptions of the specific embodiments of the disclosure, it can be obviously learned that in the coating method for liquid metal thermal grease of the disclosure, liquid metal thermal grease provided on a surface of an electronic element is scraped by a scraper of which a surface is roughened, so that the surface of the electronic element is coated with the liquid metal thermal grease. A roughened structure of the scraper helps the liquid metal thermal grease temporarily adhere to the scraper, thereby effectively coating the surface of the electronic element with the liquid metal thermal grease evenly. In addition, a coating area of the liquid metal thermal grease is limited through an opening of a limiting element, so as to avoid a case in which excessive liquid metal thermal grease overflows from the surface of the electronic element to cause short circuit of a surrounding circuit.

Although the disclosure is described with reference to the above embodiments, the embodiments are not intended to limit the disclosure. Any person skilled in the art may make variations and improvements without departing from the spirit and scope of the disclosure. Therefore, the protection scope of the disclosure should be subject to the appended claims.

What is claimed is:

1. A coating method, applied to coat an electronic element with liquid metal thermal grease, wherein the coating method comprises:
    applying the liquid metal thermal grease on a surface of the electronic element by using a limiting element that limits lateral boundaries of the liquid metal thermal grease;
    scraping the liquid metal thermal grease by a scraper, to coat the surface of the electronic element with the liquid metal thermal grease to form a first liquid metal thermal grease layer, wherein a surface of the scraper is roughened;
    removing the limiting element;
    after removing the limiting element, applying additional liquid metal thermal grease on the first liquid metal thermal grease layer without any limiting element; and
    evenly distributing the additional liquid metal thermal grease on a top surface of the first liquid metal thermal grease layer by affinity between homogeneous molecules of the liquid metal thermal grease, wherein the additional liquid metal thermal grease does not overrun the lateral boundaries of the first liquid metal thermal grease layer.

2. The coating method according to claim 1, further comprising a step of disposing the limiting element on the electronic element, a lower surface of the limiting element is against the surface of the electronic element, and at least a part of the surface of the electronic element is exposed from an opening of the limiting element.

3. The coating method according to claim 1, wherein the step of providing the liquid metal thermal grease on the surface of the electronic element by using the limiting element comprises:
    providing a predetermined amount of the liquid metal thermal grease to an area of the limiting element.

4. The coating method according to claim 3, wherein after the step of scraping the liquid metal thermal grease by the scraper, providing another predetermined amount of the liquid metal thermal grease to the area of the limiting element.

5. The coating method according to claim 1, wherein the surface of the scraper is roughened through polishing, sand blasting, or chemical etching.

6. The coating method according to claim 1, wherein the liquid metal thermal grease comprises at least gallium or a gallium compound, and content of the gallium or the gallium compound is at least more than 85%.

7. A coating method, applied to perform coating with liquid metal thermal grease, wherein the coating method comprises:
    applying the liquid metal thermal grease on a surface of a scraper;
    smearing a surface of an electronic element by using a limiting element and the surface of the scraper to form a first liquid metal thermal grease layer, wherein the surface of the scraper is roughened, and wherein the limiting element limits lateral boundaries of the liquid metal thermal grease;
    removing the limiting element;
    after removing the limiting element, applying additional liquid metal thermal grease on the first liquid metal thermal grease layer without any limiting element; and
    evenly distributing the additional liquid metal thermal grease on a top surface of the first liquid metal thermal grease layer by affinity between homogeneous molecules of the liquid metal thermal grease, wherein the additional liquid metal thermal grease does not overrun the lateral boundaries of the first liquid metal thermal grease layer.

8. The coating method according to claim 7, where before the step of smearing the surface of the electronic element by using the limiting element and the surface of the scraper, further comprising a step of:
    disposing the limiting element on the electronic element, so that a lower surface of the limiting element is against the surface of the electronic element, and at least a part of the surface of the electronic element is exposed from an opening of the limiting element.

* * * * *